United States Patent [19]

Broadbent

[11] Patent Number: 4,976,809

[45] Date of Patent: Dec. 11, 1990

[54] METHOD OF FORMING AN ALUMINUM CONDUCTOR WITH HIGHLY ORIENTED GRAIN STRUCTURE

[75] Inventor: Eliot K. Broadbent, San Jose, Calif.

[73] Assignee: North American Philips Corp, Signetics Division, Sunnyvale, Calif.

[21] Appl. No.: 452,860

[22] Filed: Dec. 18, 1989

[51] Int. Cl.[5] .................... B44C 1/22; C23F 1/02; C03C 15/00; C03C 25/06

[52] U.S. Cl. .................... 156/643; 156/644; 156/647; 156/656; 156/657; 156/659.1; 156/665; 219/121.66; 357/71; 437/194; 437/203; 437/248

[58] Field of Search ............... 156/643, 644, 646, 647, 156/653, 648, 656, 657, 659.1, 662, 665; 427/38, 39, 53.1, 54.1; 437/187, 188, 189, 190, 192, 193, 194, 203, 228, 235, 238, 241, 245, 248; 357/65, 67, 71; 219/121.65, 121.66

[56] References Cited

U.S. PATENT DOCUMENTS

| | | | |
|---|---|---|---|
| 4,124,419 | 3/1989 | Lee et al. | 437/194 X |
| 4,267,012 | 5/1981 | Pierce et al. | 437/194 X |
| 4,566,177 | 1/1986 | Vande Ven et al. | 437/194 X |
| 4,720,908 | 1/1988 | Wills | 437/203 X |
| 4,744,858 | 5/1988 | McDavid et al. | 156/643 |
| 4,758,533 | 7/1988 | Magee et al. | 437/194 X |
| 4,800,179 | 1/1989 | Mukai | 437/194 X |

*Primary Examiner*—William A. Powell
*Attorney, Agent, or Firm*—Norman N. Spain

[57] ABSTRACT

Aluminum alloy polycrystalline conductors having reduced electro-migration tendencies are formed in a semiconductor device by applying a thin film of aluminum or aluminum alloy to an array of shallow holes provided in a dielectric layer the array being patterned according to a desired interconnection pattern. A thin film of aluminum or aluminum alloy is then scanned with a laser beam sufficient to melt the film and cause it to planarize. An oriented crystal structure is formed with grain boundaries being aligned orthogonally to the rows and column of the hole pattern. A photoresist mask is then aligned with the resultant crystal structure in a manner such that boundaries extend substantially only in a direction across the width of the desired conductor lines. The aluminum which is present in the crystal structure outside the desired conductor line is then removed by plasma etching through the mask.

5 Claims, 2 Drawing Sheets

METHOD OF FORMING AN ALUMINUM CONDUCTOR WITH HIGHLY ORIENTED GRAIN STRUCTURE

BACKGROUND OF THE INVENTION

The invention in this case relates to a method of reducing the electromigration of aluminum or aluminum alloy conductors in semiconductor devices.

A frequent cause of failure in aluminum or aluminum alloy conductors employed in high density integrated circuits is found to be electromigration. Electromigration occurs particularly under the conditions of high DC current and high temperature conditions, which conditions occur very frequently in the operation of semiconductor devices. Under these conditions, aluminum metal is transported by the current passing through the aluminum containing conductors, thereby causing the aluminum to form undesired voids and undesired excess deposits. As a result, undesired resistance in these devices is increased to such an extent that an excess amount of electrical and/or heating resistance results, leading to premature failure of such devices.

It is known that electromigration in polycrystalline aluminum conductors essentially proceeds along grain boundaries. These grain boundaries, which are disordered regions between poly-crystalline grains, are characterized by a lower activation energy for diffusion than that of the bulk of the crystalline grain <111>.

Based on this information, a method is described in Pierce, U.S. Pat. No. 4,352,239 in which electromigration is significantly suppressed by a method insuring that the grain boundaries do not extend along the length of a conducting line, but rather extend directly across it.

In this method the grains of the film are formed to be at least as long as the width of the conducting lines and comparable to the length of these lines. As taught by the Pierce patent, unless the average grain size is in fact comparable to the conductor width, there is a high probability of a grain boundary extending for a sufficient distance along the length of the conducting line for electromigration to occur and resulting in failure of the semiconductor device.

Electromigration of aluminum polycrystalline conductors in semiconductor devices is significantly reduced by the method of the Pierce patent. This is achieved by forming the conductors under conditions such that the average grain size grows larger than the width of the conductors and then heat treating the conductors. As a result, grain boundaries are formed which tend to orient themselves across the conductors while the growth of grain boundaries extending along the length of the conductors is virtually stopped.

The resultant orientation of the grain boundaries which is commonly called a "bamboo" structure is found to significantly suppress electromigration in aluminum alloy polycrystalline conductors.

The van de Ven et al U.S. Pat. No. 4,566,177 also shows a method of significantly increasing the electromigration resistance of aluminum alloy conductors in semiconductor devices by the formation of a "bamboo" structure. According to the method of this patent, such a structure is formed by rapidly heating and cooling the conductors, specifically subjecting the conductors to a heat-cool cycle with a peak temperature of 520°-580° C. and as a minimum temperature, ambient temperature, and with a cycle time of about 5 to 30 seconds. The van de Ven patent shows that such cycles may be readily achieved with the use of high intensity CW visual light lamps.

SUMMARY OF THE INVENTION

It is the object of this invention to provide a novel method for the reduction of electromigration of aluminum and aluminum alloy polycrystalline conductors in semiconductor devices.

According to the method of the invention, electromigration of aluminum and aluminum alloy polycrystalline conductors is found to be significantly reduced by a method involving the following procedure.

First, an array of columns of holes of at least three hole wide rows is etched in a dielectric layer extending only partially through the layer in rows and columns and arranged in a line pattern corresponding to that of a desired interconnection pattern. The holes are positioned relatively close to each other, with the pitch being about $\frac{1}{2}$–5 $\mu$m and the depths of the holes being about 1/10 to $\frac{1}{2}$ $\mu$m.

A thin film of aluminum or aluminum alloy of a thickness sufficient to at least fill the holes is then deposited on the surface of the dielectric layer provided with these holes. The film of aluminum or aluminum alloy is then scanned with a laser beam of an intensity sufficient to melt the film and cause it to flow and to planarize. Upon cooling, the film forms an oriented crystal structure with the grain boundaries aligned orthogonally to the rows and columns of the hole pattern.

A photoresist mask is then aligned with the resultant grain structure in a manner such that the grain boundaries extend substantially only in a direction across the width of the desired conductor lines. The crystal structure outside of the desired conductor lines is then removed by plasma etching through the aligned photoresist mask.

DETAILED DESCRIPTION OF THE INVENTION

Figure 1:
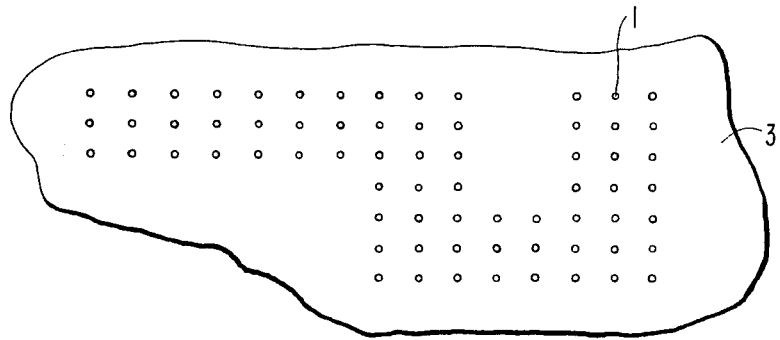
FIG. 1 is a top view of an array of holes provided in a dielectric layer according to one step of the method of the invention.

While good results have been achieved with a hole pitch of $\frac{1}{2}$–5 $\mu$m, it has been found that a hole pitch of 2–4 $\mu$m is particularly useful. In any case, however, the hole pitch should be slightly greater than the desired Al conductor linewidth. The holes are etched so as to extend only partially into the dielectric layer. Particularly good results are achieved with hole depths of 1/10-½ μm.

While the aluminum or aluminum alloy film should be at least thick enough to fill the holes, this thickness preferably should be somewhat greater, for example from ½-2 μm. These films may be deposited by any well known means such as sputtering or evaporation.

The hole diameters should be less than the desired conductor linewidth, diameters of about ½-1 μm being particularly useful.

The dielectric layer may be a layer supported by one or more underlying layers or substrates or may itself be a self-supporting substrate.

The dielectric layer is generally formed of silicon dioxide. However, silicon nitride may also be employed.

In order to improve the flow of the aluminum material during laser scanning, a thin film, on the order of several hundred Å of an inorganic material such as TiW may be deposited on the dielectric layer before deposition of the aluminum film.

To assist in the melting and planarizing of the aluminum layer, the dielectric layer may be heated to an elevated temperature (for example of about 200°-400° C.) while the aluminum film is being irradiated.

For a more complete understanding the invention will now be described in greater detail with reference to the figures of the drawing.

As shown in FIG. 1, an array of shallow holes 1 are etched into a planar layer 3 of silicon dioxide of a thickness of ~1.0 μm by plasma etching.

The holes, which are approximately 0.1-0.3 μm deep, have diameters of approximately 1 μm are etched in 3 columns across at a pitch of 2-4 μm in a line pattern identical with a desired Al interconnect mask.

Figure 2:
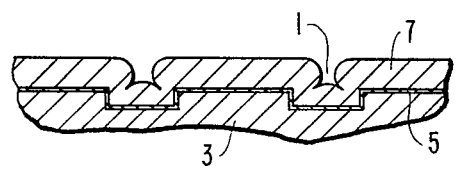
FIG. 2 is a cross-sectional view of the array of holes of FIG. 1 provided with a thin TiW layer and an Al film according to an additional step of the method of the invention.

Then, as shown in FIG. 2, a thin layer of TiW 5 of in the order of about 200-1000 Å is provided by sputtering or physical vapor deposition on the silicon dioxide layer 3 and in the holes 1.

A thin film of Al 7 of a thickness of 0.5-1.5 μm is then deposited on the thin layer of TiW.

Figure 3A:
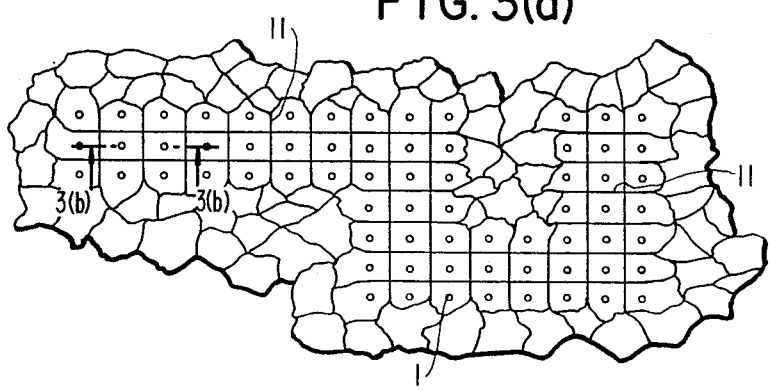
FIG. 3(a) is a top view of the aluminum film after melting by laser scanning and recrystallization showing the resultant oriented crystal structure of the aluminum film provided with grain boundaries aligned orthogonally to the rows and columns of the holes.
Figure 3B:
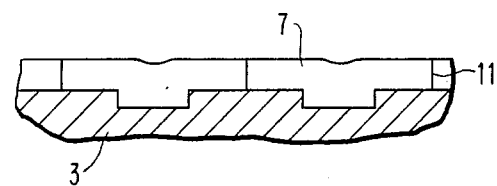
FIG. 3(b) is a cross-sectional view of the oriented crystal structure shown in FIG. 3(a).

The film of Al 7 is then scanned with a laser pulse possessing sufficient energy to melt the Al material while the layer of silicon dioxide 3 is heated to 300° C. As a result, the Al film 7 is caused to melt and flow and become planarized while recrystallized grain growth is propagated from the holes, the grain growth from adjacent holes converging, with an oriented structure being formed with grain boundaries 11 aligned orthogonally to the rows and columns of the array of holes 1 as shown in FIGS. 3(a) and 3(b).

Figure 4:
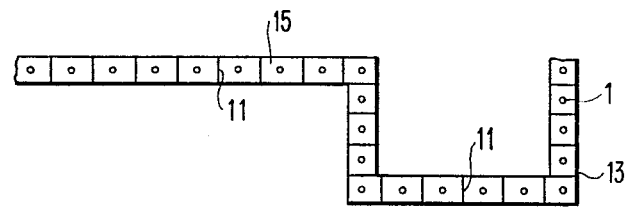
FIG. 4 is a top view of a conductor produced by the plasma etching of the oriented polycrystalline aluminum structure of FIG. 3(a) through the photoresist mask aligned with orthogonally aligned grain boundaries.

A photoresist mask (not shown) corresponding to the desired Al interconnect network is then aligned with the grain boundaries and undesired Al is then removed by plasma etching. The resultant Al conductors 13, a top view of which is shown in FIG. 4, consist of oriented grains 15 having boundaries 11 aligned perpendicular to its length.

What is claimed is:

1. A method for reducing electromigration of aluminum or aluminum alloy polycrystalline conductors on a dielectric layer of a semiconductor device comprising:
    (a) etching an array of columns of holes at least three hole wide rows in said dielectric layer, said holes extending only partially through said layer in a line pattern corresponding to that of a desiring interconnection pattern, the pitch of said holes being about ½-5 μm and said holes having a depth of 1/10-½ μm,
    (b) depositing a thin film of aluminum or aluminum alloy of a thickness at least sufficient to fill said holes on the surface of said dielectric layer provided with said holes,
    (c) scanning said film of aluminum or aluminum alloy with a laser beam of an intensity sufficient to melt said film and cause it to flow and be planarized and upon cooling forming an oriented crystal structure with grain boundaries aligned orthogonally to rows and columns of the hole pattern,
    (d) aligning a photoresist mask with said crystal structure in a manner such that grain boundaries extend substantially only in a direction across the width of the desired conductor lines, and
    (e) then removing aluminum material from said crystal structure outside of said desired conductor lines by plasma etching said crystal structure thorough said aligned photoresist mask.

2. The method of claim 1 wherein the dielectric layer is heated to a temperature of 260°-400° C. while said layer of aluminum or aluminum alloy is scanned with the laser beam.

3. The method of claim 1 wherein the holes are about 0.1-0.3 μm deep.

4. The method of claim 2 wherein the holes are about 0.1-0.3 μm deep.

5. The method of claim 1 wherein prior to the deposition of the aluminum or aluminum alloy a thin film of a flow improving material (an inorganic material) is deposited on the dielectric layer.

* * * * *